United States Patent [19]

Ebinuma

[11] Patent Number: 5,170,418
[45] Date of Patent: Dec. 8, 1992

[54] X-RAY EXPOSURE APPARATUS
[75] Inventor: Ryuichi Ebinuma, Machida, Japan
[73] Assignee: Canon Kabushiki Kaisha, Tokyo, Japan
[21] Appl. No.: 716,970
[22] Filed: Jun. 18, 1991
[30] Foreign Application Priority Data Jun. 19, 1990 [JP] Japan ................................ 2-158691

[51] Int. Cl.⁵ .......................................... G21K 5/00
[52] U.S. Cl. ..................................... 378/34; 378/210
[58] Field of Search ........................................ 378/34

[56] References Cited

U.S. PATENT DOCUMENTS 5,001,734  3/1991  Uda et al. ............................. 378/34

FOREIGN PATENT DOCUMENTS

238416  9/1987  European Pat. Off. .............. 378/34
64-61700  3/1989  Japan .

Primary Examiner—Craig E. Church
Attorney, Agent, or Firm—Fitzpatrick, Cella, Harper & Scinto

[57] ABSTRACT

An X-ray exposure method and apparatus wherein an exposure chamber coupled with a synchrotron radiation device through a beam line receives synchrotron radiation through a window material provided on the beam line to execute an exposure process, a pressure sensor detects pressure in the exposure chamber, a cutoff valve is provided in a portion of the beam line between the window material and the synchrotron radiation device, and a bypass has a communication valve for communicating a portion of the beam line between the window material and the cutoff valve with a portion between the window material and the exposure chamber. In addition, a vacuum evacuating device effects evacuation of a portion of the beam line between the window material and the cutoff vlave, a pump valve is disposed in a conduit, coupling the beam line with the vacuum evacuating device, and a controller responds to a pressure detected by the pressure sensor so that, when the detected pressure represents a steady state lower than a predetermined pressure, the controller operates to open the cutoff valve and the pump valve and to close the communication valve and, when the detected pressure is higher than the predetermined pressure, the controller operates to close the cutoff valve and the pump valve and thereafter to open the communication valve.

17 Claims, 5 Drawing Sheets

X-RAY EXPOSURE APPARATUS

FIELD OF THE INVENTION AND RELATED ART

This invention relates to an X-ray exposure apparatus and, more particularly, to an X-ray exposure apparatus for executing exposure by using synchrotron orbital radiation light (hereinafter "SOR light"). In another aspect, the invention is concerned with a semiconductor processing method which uses such an X-ray exposure apparatus.

An X-ray exposure apparatus for executing exposure by using SOR light includes a synchrotron radiation device for producing the SOR light. The synchrotron radiation device is maintained in an ultra high vacuum, and an exposure chamber for accommodating a mask or a wafer is coupled to the synchrotron radiation device by means of a beam line.

Figure 5:
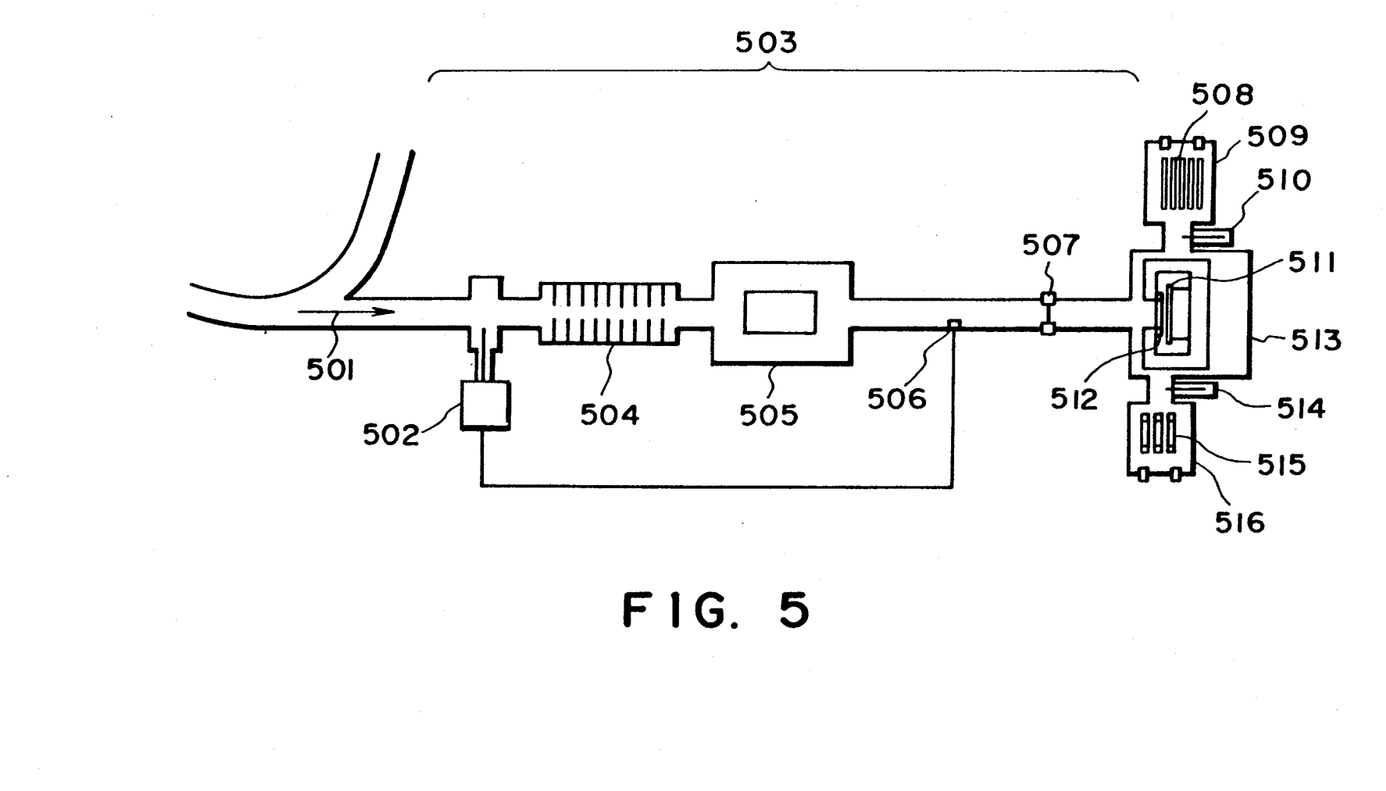
FIG. 5 is a diagram showing the structure of a known example.

In an X-ray exposure apparatus of such a structure, there is a possibility that if leakage occurs in the beam line or the exposure chamber an atmospheric gas enters the synchrotron radiation device. In an attempt to avoid this, an arrangement such as shown in FIG. 5 has been proposed (Japanese Laid-Open Patent Application No. Sho 64-61700).

SOR light 501 produced by a synchrotron radiation device (not shown) goes along a beam line 503 and through a window material 507, provided on the beam line 503, and irradiates a mask 512 and a wafer 511 placed in an exposure chamber 503. The beam line is equipped with a shock wave delay tube 502, for retarding advancement of shock waves resulting from vacuum leakage, and a mirror chamber 505 for expanding the SOR light 501, disposed in this order. Provided between the mirror chamber 505 and the window material 507 is a pressure sensor 506, and provided between the synchrotron radiation device and the delay tube 504 is an emergency cutoff valve 502 which is operable in response to the detection by the pressure sensor 506. The mask 515 and the wafer 511 accommodated in the exposure chamber 513 can be replaced by any one of masks 515 accommodated in a mask pre-chamber 516 and any one of wafers 511 accommodated in a wafer pre-chamber 509, respectively, with the cooperation of gate valves 514 and 510, respectively.

If the window material 507 is broken as a result of leakage in the beam line 503 or in the exposure chamber 513, in response the pressure detected by the pressure sensor 512 increases and the emergency cutoff valve 502 closes to block entry of atmospheric gas into the synchrotron radiation source device.

SUMMARY OF THE INVENTION

In the X-ray exposure apparatus of the type described above, the pressure sensor for detecting abnormal pressure is provided at a side (upstream side) of the window material closer to the synchrotron radiation device. If, therefore, the leakage occurs in the exposure chamber, the sensor does not directly detects the leakage but it detects the same after the window material breaks. If the window material breaks, the fractions thereof scatter into the exposure chamber and the beam line. This necessitates complicated operations for recovery as well as a long time until the exposure operation starts again.

It is accordingly an object of the present invention to provide an X-ray exposure apparatus by which, in an occasion where leakage occurs in an exposure chamber, protection of a synchrotron radiation device can be done without breakage of a window material.

In accordance with an aspect of the present invention, there is provided an X-ray exposure apparatus, comprising: an exposure chamber to be coupled with a synchrotron radiation device through a beam line for receiving synchrotron radiation applied through a window material provided on the beam line to execute an exposure process in said exposure chamber; pressure detecting means for detecting pressure in said exposure chamber; a cutoff valve provided in a portion of the beam line between the window material and the synchrotron radiation device; a bypass having a communication valve for communicating a portion of the beam line between the window material and said cutoff valve with a portion between the window material and said exposure chamber; vacuum evacuating means for vacuum evacuating a portion of the beam line between the window material and said cutoff valve; a pump valve provided in a conduit for coupling the beam line with said vacuum evacuating means; and a controller responsive to a pressure detected by said pressure detecting means, wherein, when in the exposure operation the detected pressure represents a steady state lower than a predetermined pressure, said controller operates to open said cutoff valve and said pump valve and to close said communication valve, and wherein, when in the exposure operation the detected pressure is higher than the predetermined pressure, said controller operates to close said cutoff valve and said pump valve and thereafter to open said communication valve.

A second cutoff valve may be provided in a portion of the beam line between the window material and the exposure chamber, the opening and closing being controlled in a similar way as the cutoff valve provided in a portion of the beam line between the window material and the synchrotron radiation device.

The structure may be modified so that it includes only a cutoff valve in a portion of the beam line between the window material and the exposure chamber as well as the controller.

If leakage occurs in the exposure chamber during the exposure operation and the detected pressure increases beyond the predetermined pressure, the cutoff valve and the pump valves are closed and, thereafter, the communication valve is opened. Since the cutoff valve is closed before the communication valve is opened, there is no possibility of entry of a gas in the exposure chamber into the synchrotron radiation device. The opening of the communication valve is effective to avoid application of a pressure to the window material and, as a result, the window material is not damaged. A vacuum pump is provided to vacuum evacuate a predetermined portion of the beam line. When the exposure operation is to be re-started, the communication valve is closed and, thereafter, the pump valve is opened so as to vacuum evacuate any gas in the exposure chamber having been entered into between the window material and the cutoff valve. After this, the cutoff valve is opened. Thus, similarly to the moment as the cutoff valve is closed, it is possible to prevent entry of the gas in the exposure chamber into the synchrotron radiation device.

These and other objects, features and advantages of the present invention will become more apparent upon a consideration of the following description of the pre-

DESCRIPTION OF THE PREFERRED EMBODIMENTS

Figure 1:
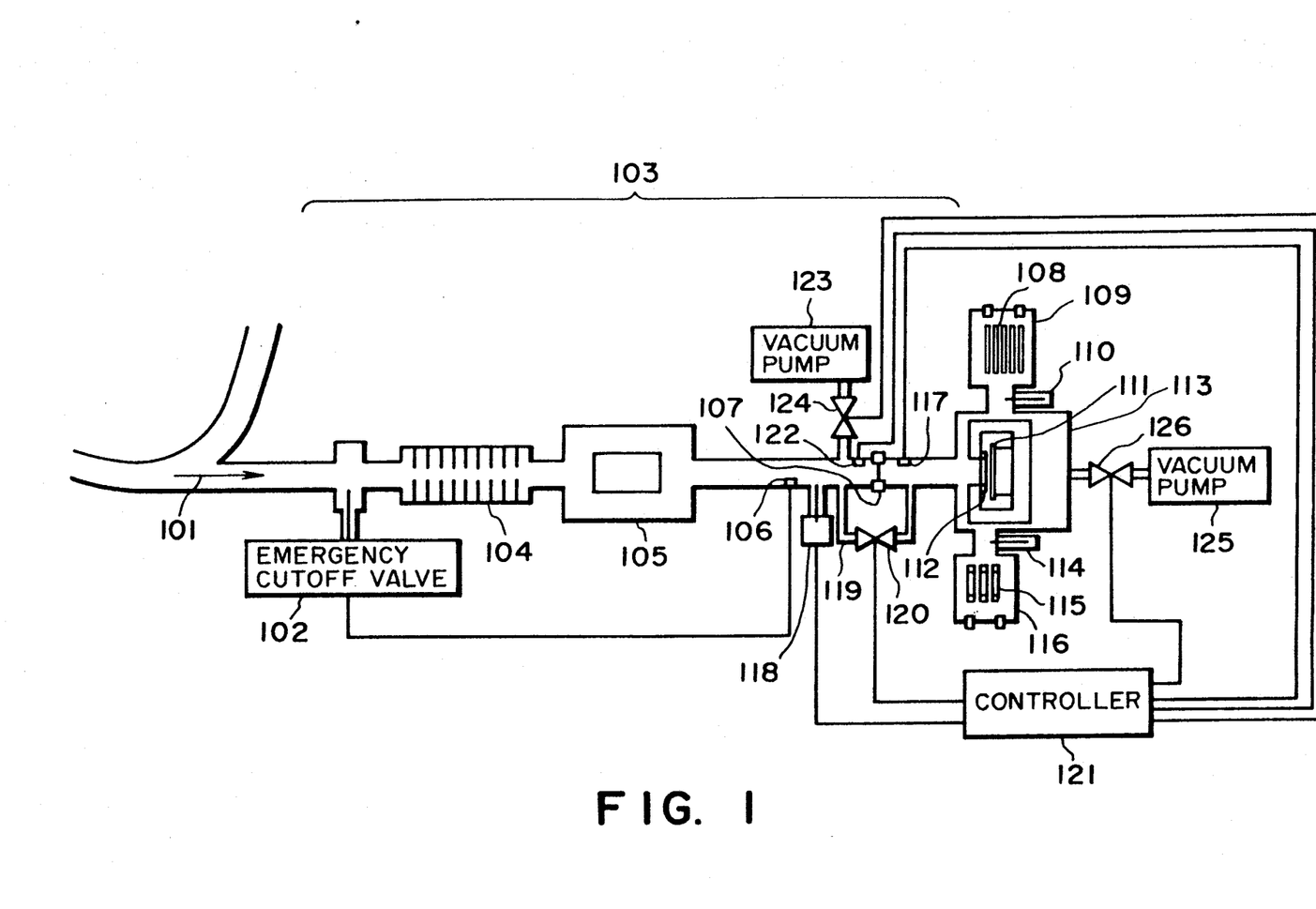
FIG. 1 is a diagram showing the structure of a first embodiment of the present invention.

FIG. 1 shows a first embodiment of the present invention.

SOR light 101 produced by a synchrotron radiation device (not shown) goes along a beam line 103 and through a window material 107, provided on the beam line 103, and irradiates a mask 112 and a semiconductor wafer 111 accommodated in an exposure chamber 113. This irradiation contributes to processing the wafer 111 surface in accordance with a pattern of the mask 112. The beam line 103 is equipped with a shock wave delay tube 104, for retarding advancement of shock waves resulting from vacuum leakage, and a mirror chamber 105 for expanding the SOR light 101, disposed in this order. Provided between the mirror chamber 105 and the window material 107 is a pressure sensor 106, and provided between the synchrotron radiation device and the delay tube 104 is an emergency cutoff valve 102 which is operable in response to the detection by the pressure sensor 106. The mask 112 and the wafer 111 accommodated in the exposure chamber 113 can be replaced by any one of masks 115 accommodated in a mask pre-chamber 116 and any one of wafers 108 accommodated in a wafer pre-chamber 109, respectively, with the cooperation of gate valves 114 and 110, respectively.

If the window material 107 is broken as a result of leakage in the beam line 103 or in the exposure chamber 113, like the FIG. 5 case, in response, the pressure detected by the pressure sensor 106 increases and the emergency cutoff valve 102 closes to block entry of atmospheric gas into the synchrotron radiation source device.

The beam line of the present embodiment is further equipped with a pressure sensor (pressure detecting means) 117 for detecting the pressure in the exposure chamber 113; a cutoff valve 118 effective to intercept the mirror chamber 105 and the window 107 from each other; a bypass 119 for defining a bypass, communicating through a communication valve 120 the exposure chamber with a portion between the cutoff valve 118 and the window material 107; and a vacuum pump (vacuum evacuating means) 123 for vacuum evacuating a portion between the window 107 and the cutoff valve 118. The vacuum pump 123 is communicated with the aforementioned portion of the beam line by means of a conduit having a pump valve (switch valve) 122. The pressure sensor 117 is provided between the window material 107 and the exposure chamber 118, while the pressure sensor 122 is provided between the window material 107 and the cutoff valve 118. The exposure chamber 113 is equipped with a vacuum pump 125 for vacuum evacuation of the chamber interior through a pump valve 126. Outside the beam line 103 and the exposure chamber 113 of the structure described above, there is provided a controller 121 for controlling the operations of the cutoff valve 118 and the communication valve 120 as well as the operations of the pump valves 124 and 126, in response to the pressure as detected by the pressure sensor 117 or 122.

The wafer 111 placed in the exposure chamber 113 is exposed with the SOR light 101, having passed through the beam line 103 and the window material 107 and having been partially blocked by the mask 112. During this exposure process, heat is generated in the mask due to irradiation with the SOR light 101. In consideration thereof, the exposure chamber 113 is filled with a reduced-pressure gas ambience (e.g. He gas of 150 Torr), reduced to an order assuring necessary heat conduction. The window material 107 should have good transmissivity to the SOR light 101, and it may be a thin beryllium material (10–20 micron thickness). The inside pressure $P_S$ (e.g. 150 Torr) of the exposure chamber 113 is so set as to be lower than the withstand pressure $P_L$ of the window material 107 of the aforementioned thickness.

Like the FIG. 5 example, for replacement of the mask 112 or the wafer 111 by any one of masks 115 accommodated in a mask pre-chamber 116 or any one of wafers 108 accommodated in a wafer pre-chamber 109, the wafer pre-chamber 109 or the mask pre-chamber 116 is maintained in a state (load-locked state) filled with an ambience similar to that in the exposure chamber 113.

While not shown in the drawing, each of the exposure chamber 113, the wafer pre-chamber 109 and the mask pre-chamber 106 is equipped with vacuum evacuating means and gas supplying means for accomplishing the above-described inside ambience, with pressure control. Only illustrated in FIG. 1 is the vacuum pump (vacuum evacuating means) 125 communicated with the exposure chamber 113 by way of a conduit having the pump valve (switch valve) 126.

In normal exposure operation, the emergency cutoff valve 102 and the cutoff valve 118 as well as the pump valve 122 are all maintained open, while the communication valve 120 is kept closed. Thus, also the vacuum pump 123 serves to maintain the vacuum in the beam line 103.

If leakage occurs in the beam line during the exposure operation, the leakage is detected by the pressure sensor 106 as in the FIG. 5 example, and the emergency cutoff valve 102 is closed for protection of the synchrotron radiation device. The leakage detection in regard to the exposure chamber 113 as well as the protection of the window material 107 are made under the control of the controller 121.

Figure 2A:
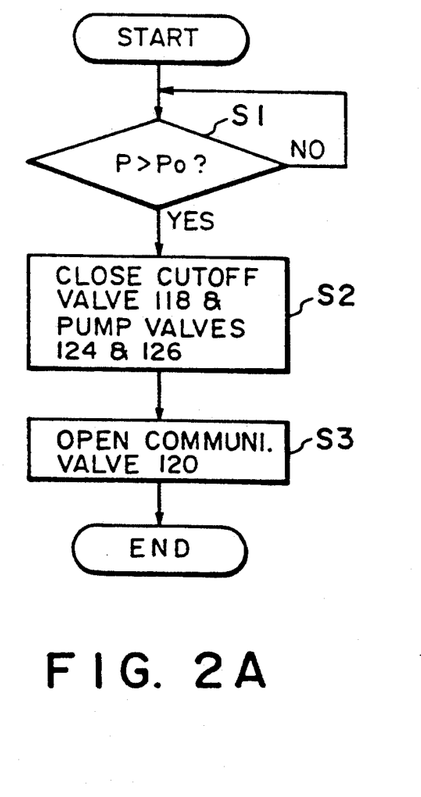
FIGS. 2A and 2B are flow charts each showing the operation of a controller 121 in FIG. 1.

FIG. 2A is a flow chart showing the operation of the controller 121 during the exposure operation.

In the exposure operation, the controller 121 continuously monitors (step S1) whether the pressure P in the exposure chamber 113 as detected by the pressure sensor 117 is higher than a predetermined pressure $P_O$ ($P_S < P_O < P_L$). If a failure in load-locking occurs in the mask pre-chamber 106 or in the wafer pre-chamber 109 or a failure in pressure adjustment occurs in the exposure chamber 113 and, as a result, the pressure P becomes higher than the predetermined pressure $P_O$, then the cutoff valve 118 as well as the pump valves 124 and 126 are closed (step S2) and, subsequently, the communication valve 120 is opened (step S3). Since the cutoff valve 118 is closed before the pressure P reaches the withstand pressure $P_L$ of the window material 107, at least the scattering of fractions of the window material 107 at an upstream portion of the beam line can be prevented. Also, since the communication valve 122 is opened before the pressure P reaches the withstand pressure $P_L$ of the window material 107, it is possible to effectively prevent application of pressure to the window material and, thus, to avoid breakage of the window material 107.

Figure 2B:
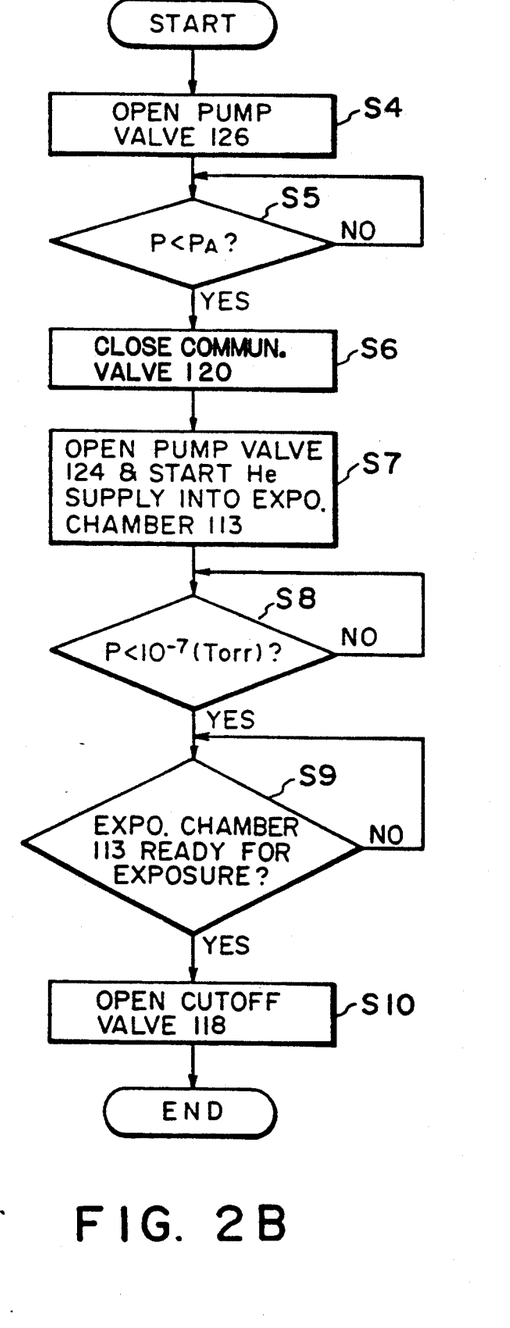

FIG. 2B is a flow chart showing the operation of the controller 121 after the leakage in the exposure chamber is fixed so that the exposure operation is going to be re-started.

At the re-start, the controller 121 opens the pump valve 126 (step S4) and causes the vacuum pump 125 to effect the vacuum evacuation of the exposure chamber 113. This operation continues until the pressure P detectable by the pressure sensor 117 becomes lower than a predetermined pressure $P_A$ (e.g. about $10^{-3}$ Torr) (step S5). If $P<P_A$ is satisfied, the communication valve 120 is closed (step S6). Then, the pump valve 124 is opened to start the introduction of He gas into the exposure chamber 113 (step S7). After this, whether the pressure P as detected by the pressure sensor 122 is lower than a vacuum level (e.g. $10^{-7}$ Torr) required in the beam line 103 for the exposure process, is checked (step S8). Further, whether the inside pressure of the exposure chamber 113 is at the predetermined level for the exposure process so that it allows the exposure process, is checked (step S9). After this, the cutoff valve 118 is opened (step S10).

With the above-described operations, it is possible to prevent entry of He gas into the beam line 103 and, thus, to re-start the exposure process smoothly.

Figure 3:
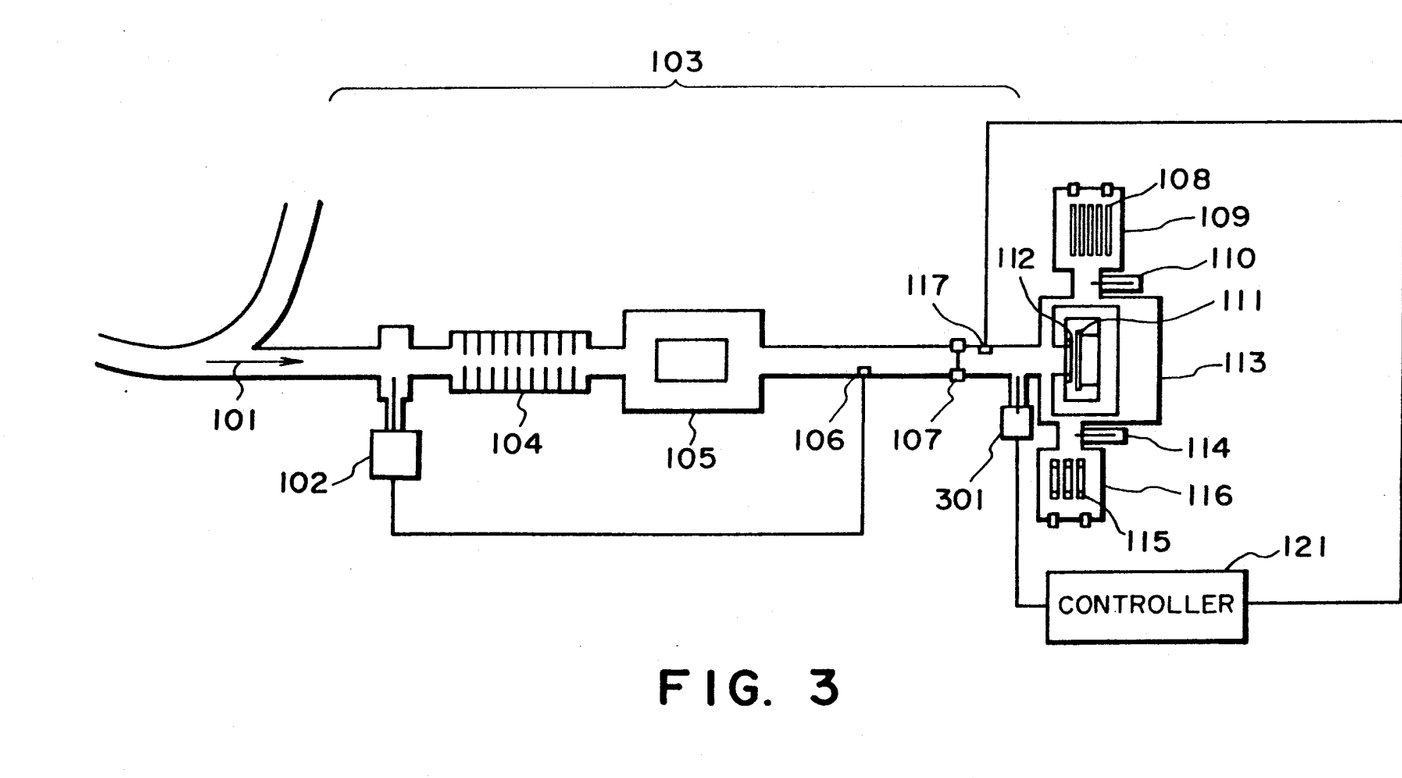
FIGS. 3 and 4 are diagrams showing the structures of second and third embodiments of the present invention, respectively.

FIG. 3 shows a second embodiment of the present invention. This embodiment corresponds to a simplified form of the FIG. 1 embodiment and an additional cutoff valve 301 is provided. Corresponding elements are denoted by the same reference numerals, and explanation of them is now omitted.

In the present embodiment, the cutoff valve 118, the bypass 119, the communication valve 120, the pump valve 122 and the vacuum pump 123 of the FIG. 1 embodiment are omitted. At a position in the exposure chamber 113 and adjacent to the window material 107 and at such position interposing the pressure sensor 117 between it and the window material 107, the cutoff valve 301 is provided (the operation of the cutoff valve 301 is controlled by the controller 121). In FIG. 3, the vacuum pump 125 and the pump valve 126 provided in the exposure chamber 113 are not illustrated.

When the pressure P detected by the pressure sensor 117 becomes higher than a predetermined pressure $P_O$, the controller 121 closes the cutoff valve 301. This prevents application of additional pressure to the window material 107 and, thus, avoids breakage of the window material 107.

Figure 4:
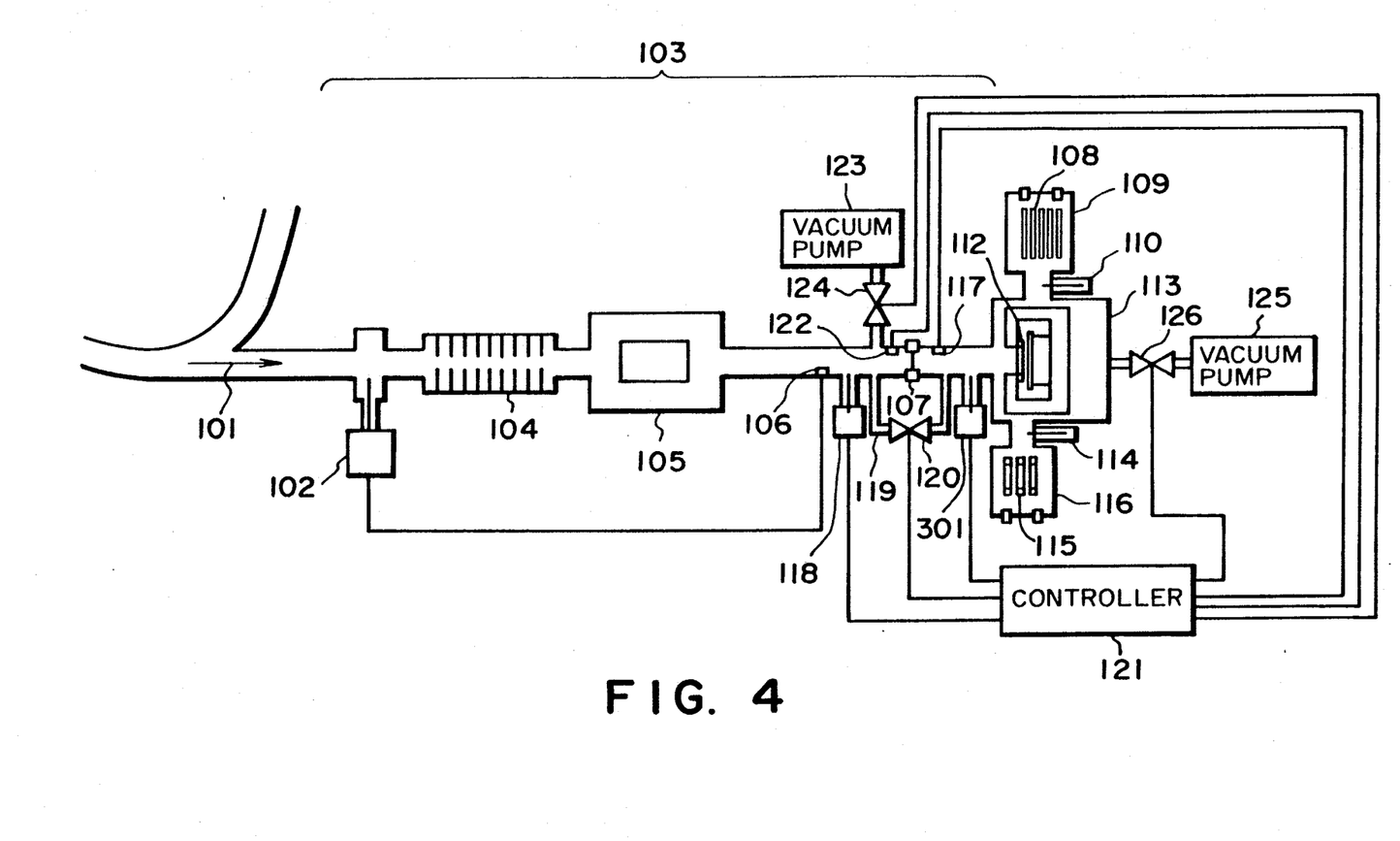

FIG. 4 shows a third embodiment of the present invention.

This embodiment corresponds to a combined form of the first and second embodiments, wherein, to the first embodiment, a cutoff valve 301 is added which valve is provided between the exposure chamber 113 and the portion of the bypass 119 communicating with the exposure chamber 113. Thus, similar elements as of the first and second embodiments are denoted by the same reference numerals as of FIGS. 1 and 3, and explanation of them is now omitted.

The operation of the present embodiment is essentially the same as that shown in FIGS. 2A and 2B, and the opening/closing motion of the cutoff valve 118 and the opening/closing motion of the cutoff valve 301 are operationally associated with each other. This assures that, after the cutoff valves 118 and 301 are closed, no stress is applied to the window material as a result of the leakage. Thus, the level of safety is enhanced significantly.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus, comprising:
   an exposure chamber to be coupled with a synchrotron radiation device through a beam line for receiving synchrotron radiation applied through a window material provided on the beam line to execute an exposure process in said exposure chamber;
   pressure detecting means for detecting pressure in said exposure chamber;
   a first cutoff valve provided in a portion of the beam line between the window material and the synchrotron radiation device;
   a bypass having a communication valve for communicating a portion of the beam line between the window material and said cutoff valve with a portion between the window material and said exposure chamber;
   vacuum evacuating means for vacuum evacuating a portion of the beam line between the window material and said cutoff valve;
   a pump valve provided in a conduit for coupling said vacuum evacuating means with the beam line;
   a controller responsive to pressure detected by said pressure detecting means, wherein, when in the exposure process the detected pressure represents a steady state lower than a predetermined pressure, said controller operates to open said first cutoff valve and said pump valve and to close said communication valve, and wherein, when in the exposure process the detected pressure is higher than the predetermined pressure, said controller operates to close said cutoff valve and said pump valve and thereafter to open said communication valve; and
   a second cutoff valve disposed in a portion of the beam line between the window material and said exposure chamber, said controller responsive to pressure detected by said pressure detecting means, wherein, when in the exposure process the detected pressure represents a steady state lower than a predetermined pressure, said controller operates to open said second cutoff valve, and wherein, when in the exposure process the detected pressure is higher than the predetermined pressure, said controller operates to close said second cutoff valve.

2. A semiconductor device manufacturing method for use with a synchrotron radiation source and an exposure system, comprising the steps of:
   placing a substrate in the exposure system into which radiation from the radiation source can be guided along a beam line;

detecting with a pressure detector pressure at an exposure system side of a blocking window provided along the beam line to separate a radiation source side from the exposure system side;

changing a valve from its open position to its closed position when the pressure detected by the pressure detector is higher than a predetermined pressure, wherein the valve is disposed along the beam line and between the blocking window and the exposure system and wherein the predetermined pressure is between a set pressure at the exposure system side and a withstand pressure of the blocking window; and exposing the substrate with radiation passing through the blocking window when the pressure detected by the pressure detector is not higher than the predetermined pressure.

3. An X-ray exposure apparatus, comprising:

an exposure chamber to be coupled with a synchrotron radiation device through a beam line for receiving synchrotron radiation applied through a window material provided on the beam line to execute an exposure process in said exposure chamber;

pressure detecting means for detecting pressure in said exposure chamber;

a cutoff valve provided in a portion of the beam line between the window material and said exposure chamber; and a controller responsive to pressure detected by said pressure detecting means, wherein, when in the exposure process the detected pressure represents a steady state lower than a predetermined pressure, said controller operates to open said cutoff valve and, when in the exposure process the detected pressure is higher than the predetermined pressure, said controller operates to close said cutoff valve.

4. A semiconductor processing method usable with an exposure apparatus having an exposure chamber coupled with a synchrotron radiation source through a beam line for exposing a semiconductor substrate placed in the exposure chamber to a synchrotron radiation beam from the radiation source, passing through a window material provided on the beam line, comprising the steps of:

detecting an inside pressure of the exposure chamber;

comparing the detected pressure to a predetermined pressure;

exposing the semiconductor substrate to the synchrotron radiation beam when the inside pressure of the exposed chamber is not higher than a predetermined level; and isolating the window material from the exposure chamber when the inside pressure of the exposure chamber is higher than a predetermined level.

5. An exposure apparatus for use with a synchrotron radiation source, comprising:

an exposure system;

a beam line for guiding synchrotron radiation from the radiation source to said exposure system;

a blocking window disposed in the beam line for separating a radiation source side from an exposure system side, wherein the radiation can pass through said blocking window;

a first openable and closable valve disposed along the beam line and between the radiation source and said blocking window;

a bypass line for providing a bypass between the radiation source side and said exposure system side, wherein a first end of said bypass line is coupled to a portion of said beam line which is between said first valve and said blocking window;

a second openable and closable valve provided along said bypass line;

a vacuum pump coupled to a portion of the beam line which is between said first valve and said blocking window; and a third openable and closable valve disposed along a vacuum line of said vacuum pump.

6. An apparatus according to claim 5, further comprising a pressure detector for detecting pressure at the exposure system side, wherein said first and third valves are changed from the open position to the closed position and said second valve is changed from the closed position to the open position when the pressure detected by said pressure detector is higher than a predetermined pressure.

7. An apparatus according to claim 6, wherein said second valve is changed from the closed position to the open position after the first and third valves are changed from the open positions to the closed positions.

8. An apparatus according to claim 5, further comprising a fourth openable and closable valve disposed along said beam line and between said blocking window and said exposure system, wherein a second end of said bypass line is coupled to a portion of said beam line which is between said blocking window and said fourth valve.

9. An apparatus according to claim 8, further comprising a pressure detector for detecting pressure at the exposure system side, wherein each of said first, third and fourth valves is changed from the open position to the closed position while said second valve is changed from the closed position to the open position when the pressure detected by said pressure detector is higher than a predetermined pressure.

10. An exposure apparatus for use with a synchrotron radiation source, comprising:

an exposure system;

a beam line for guiding synchrotron radiation from the radiation source to said exposure system;

a blocking window disposed in the beam line for separating a radiation source side from an exposure system side, wherein the radiation can pass through said blocking window;

a first openable and closable valve disposed along the beam line and between the radiation source and said blocking window;

a bypass line for providing a bypass between the radiation source side and said exposure system side, wherein a first end of said bypass line is coupled to a portion of said beam line which is between said first valve and said blocking window;

a second openable and closable valve provided along said bypass line; and a pressure detector for detecting pressure at the exposure system side, wherein said first valve is changed from the open position to the closed position and said second valve is changed from the closed position to the open position when the pressure detected by said pressure detector is higher than a predetermined pressure, with the predetermined pressure being a pressure between a set pressure at the exposure system side and a withstand pressure of said blocking window.

11. An apparatus according to claim 10, further comprising a third openable and closable valve disposed along said beam line and between said blocking window and said exposure system, wherein a second end of said bypass line is coupled to a portion of said beam line which is between said blocking window and said third valve.

12. An apparatus according to claim 11, wherein said third valve is changed from the open position to the closed position when the pressure detected by said pressure detector is higher than a predetermined pressure.

13. An exposure apparatus for use with a synchrotron radiation source, comprising:
    an exposure system;
    a beam line for guiding synchrotron radiation from the radiation source to said exposure system;
    a blocking window disposed in the beam line for separating a radiation source side from an exposure system side, wherein the radiation can pass through said blocking window; and
    an openable and closable valve disposed along the beam line and between said blocking window and said exposure system.

14. An apparatus according to claim 13, further comprising a pressure detector for detecting pressure at the exposure system side, wherein said valve is changed from the open position to the closed position when the pressure detected by said pressure detector is higher than a predetermined pressure.

15. A semiconductor device manufacturing method for use with a synchrotron radiation source and an exposure system, comprising the steps of:
    placing a substrate in the exposure system into which radiation from the radiation source can be guided along a beam line;
    detecting with a pressure detector pressure at an exposure system side of a blocking window provided along the beam line to separate a radiation source side from the exposure system side;
    changing a first valve from the open position to the closed position when the pressure detected by the pressure detector is higher than a predetermined pressure, wherein the first valve is disposed along the beam line and between the radiation source and the blocking window and wherein the predetermined pressure is between a set pressure at the exposure system side and a withstand pressure of the blocking window;
    changing a second valve from the closed position to the open position when the pressure detected by the pressure detector is higher than the predetermined pressure, wherein the second valve is disposed along a bypass line connected between the radiation source side and the exposure system side and wherein a first end of the bypass line is coupled to a portion of the beam line which is between the first valve and the blocking window; and
    exposing the substrate with radiation passing through the blocking window when the pressure detected by the pressure detector is not higher than the predetermined pressure.

16. A method according to claim 15, further comprising the step of changing a third valve from the open position to the closed position when the pressure detected by the pressure detector is higher than the predetermined pressure, wherein the third valve is disposed along the beam line and between the blocking window and the exposure system.

17. A method according to claim 16, wherein a second end of the bypass line is coupled to a portion of the beam line which is between the blocking window and the third valve.

* * * * *

UNITED STATES PATENT AND TRADEMARK OFFICE
CERTIFICATE OF CORRECTION

PATENT NO. : 5,170,418
DATED : December 8, 1992
INVENTOR(S) : Ryuichi Ebinuma

It is certified that error appears in the above-identified patent and that said Letters Patent is hereby corrected as shown below:

COLUMN 1:

Line 32, "delay tube 502" should read --delay tube 504--.
Line 44, "wafers 511" should read --wafers 508--.
Line 60, "detects" should read --detect--.

Signed and Sealed this

First Day of February, 1994

BRUCE LEHMAN

Attest:

Attesting Officer

Commissioner of Patents and Trademarks